(12) United States Patent  
Schmitt

(10) Patent No.: US 6,490,037 B1
(45) Date of Patent: Dec. 3, 2002

(54) METHOD AND APPARATUS FOR VERIFYING A COLOR OF AN LED IN A PRINTED CIRCUIT BOARD

(75) Inventor: Kevin Schmitt, Hoffman Estates, IL (US)

(73) Assignee: Test Coach Corporation, Hoffman Estates, IL (US)

( * ) Notice: Subject to any disclaimer, the term of this patent is extended or adjusted under 35 U.S.C. 154(b) by 24 days.

(21) Appl. No.: 09/712,371

(22) Filed: Nov. 13, 2000

(51) Int. Cl.⁷ ................................................. G01N 21/25
(52) U.S. Cl. ..................... 356/416; 356/402; 356/425
(58) Field of Search .................. 356/416, 402, 356/425

(56) References Cited

U.S. PATENT DOCUMENTS

| | | | | |
|---|---|---|---|---|
| 4,681,454 A | * | 7/1987 | Breemer | 250/205 |
| 5,568,267 A | * | 10/1996 | Sunamori et al. | 356/416 |
| 6,127,783 A | * | 10/2000 | Pashley et al. | 250/205 |

* cited by examiner

Primary Examiner—Frank G. Font
Assistant Examiner—Roy M. Punnoose
(74) Attorney, Agent, or Firm—Pauley Petersen Kinne & Erickson

(57) ABSTRACT

A method and apparatus for verifying a color of an LED in a printed circuit board include a sensor that permits passage of light from a target wavelength of the color and generates a resulting output voltage based upon an intensity of light of the target wavelength. A test system analyzes the resulting output voltage and provides a pass/fail signal to indicate whether the LED is the correct color and/or in operation.

15 Claims, 4 Drawing Sheets

METHOD AND APPARATUS FOR VERIFYING A COLOR OF AN LED IN A PRINTED CIRCUIT BOARD

BACKGROUND OF THE INVENTION

1. Field of the Invention

This invention relates to a method and apparatus for verifying a color of an LED in a printed circuit board.

2. Description of Related Art

Printed circuit boards often contain one or more light emitting diodes (LEDs) used as external signals, internal diagnostics and for other suitable applications. Typically, verification of the operation of a printed circuit board having LEDs required powering up a fully rendered printed circuit board and manually verifying the operation of the LEDs. Alternatively, a test fixture may be constructed including bulky and expensive fiber optics that extend between the printed circuit board to be tested and a test system.

SUMMARY OF THE INVENTION

A method and apparatus for verification of a color of an LED according to a preferred embodiment of this invention eliminates much of the time-consuming and costly procedures required by manual verification and the equally costly test fixtures having multiple and complex fiber optic runs.

The apparatus according to a preferred embodiment of this invention includes a sensor. The sensor preferably includes, in combination, a photosensitive semiconductor, an optical filter, a pair of probes and a bias resistor. The optical filter preferably permits only light from a target wavelength of the color to be detected from the LED to pass. The probes are connected with respect to the photosensitive semiconductor and the optical filter and pass current generated from the photosensitive semiconductor across the bias resistor. As a result of the described construction, the sensor provides an output voltage corresponding to a target wavelength corresponding to an appropriate color of the LED and blocks light outside of the target wavelength.

In addition, a test system is in communication with the sensor for converting the output voltage into a machine or operator-readable pass/fail signal. The test system may be an in-circuit tester in combination with software suitable for translating the output signal from the sensor into such a pass/fail signal. The test system may additionally include a verification module for determining whether the output voltage exceeds a predetermined minimum test voltage for the intensity of light of the target wavelength and/or a warning signal to indicate excessive ambient light between the sensor and the LED.

The software and/or the test system may be configured to include the steps of: (1) measuring a $V_{on}$ across the sensor when the LED is on; (2) measuring a $V_{off}$ across the sensor when the LED is off; (3) subtracting the $y_{off}$ from the $Y_{on}$ to determine a nominal voltage; and (4) comparing the nominal voltage with a predetermined minimum voltage for the color to be verified.

It is one object of this invention to provide a method and apparatus for accurately and inexpensively verifying a color of an LED.

It is another object of this invention to provide a method and apparatus for verifying a color of an LED in a printed circuit board without requiring a fully operational and powered printed circuit board.

It is yet another object of this invention to provide a method and apparatus for verifying a color of an LED wherein existing test fixtures can be adapted for use in connection with the apparatus.

It is still another object of this invention to provide a method and apparatus for verifying a color of an LED that does not require adjustment of potentiometers or placement of optical cables.

It is yet another object of this invention to provide a method and apparatus for verifying a color of an LED that can utilize a common return and thus use only a single wire per sensor plus one for the common return.

BRIEF DESCRIPTION OF THE DRAWINGS

The above-mentioned and other features and objects of this invention will be better understood from the following detailed description taken in conjunction with the drawings wherein.

DESCRIPTION OF PREFERRED EMBODIMENTS

Figure 1:
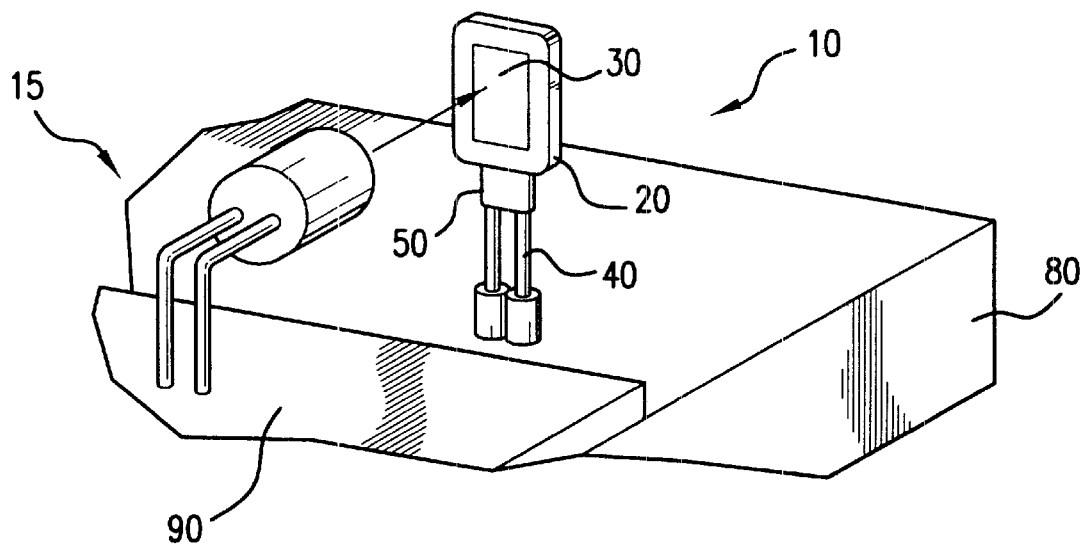
FIG. 1 is a diagrammatic perspective view of an LED and a sensor in a system according to a preferred embodiment of this invention.
Figure 2:
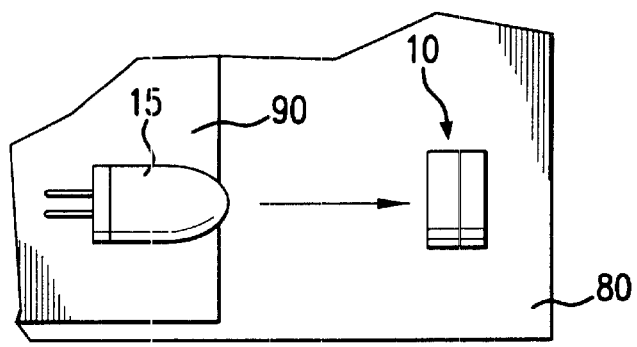
FIG. 2 is a diagrammatic top view of the LED and the sensor shown in FIG. 1 according to a preferred embodiment of this invention.
Figure 3:
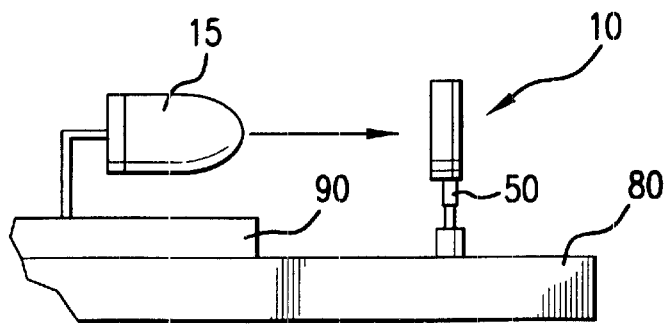
FIG. 3 is a diagrammatic side view of the LED and the sensor shown in FIG. 1 according to a preferred embodiment of this invention.

According to one preferred embodiment of this invention, an apparatus and system for verifying a color of LED 15 in printed circuit board 90 is shown in FIGS. 1–3. LEDs 15 are typically used in printed circuit boards 90 and require verification of their operation in a different manner than the traditional manner of verification of the placement and operation of integrated circuits within printed circuit board 90. LEDs 15 are available in clear/white and several common colors such as red, green and blue. Beyond mere verification of the operation of LED 15, it is also preferable, and an object of this invention, to confirm that LED 15 of the intended color is in the desired position in printed circuit board 90.

The apparatus according to a preferred embodiment of this invention includes sensor 10. As described in more detail below, sensor 10 comprises an assembly of components that may be used in connection with test systems and test fixtures for quickly and accurately verifying the color of LED 15. Sensor 10, otherwise known as a FINN™ sensor, is preferably positioned in physical proximity to LED 15 to be tested.

According to one preferred embodiment of this invention, and as shown in FIG. 1, sensor 10 preferably comprises photosensitive semiconductor 20. Photosensitive semiconductor 20 may comprise an Si photodiode such as those manufactured by Hamamatsu with part numbers S6428, S6429 and S6430.

Sensor 10 additionally includes optical filter 30 connected with respect to the photosensitive semiconductor which permits only light from a target wavelength of the color to be detected to pass. Table 1 indicates a nominal wavelength emitted by several colors of standard LEDs 15 in addition to a peak sensitivity of sensor 10 according to a preferred embodiment of this invention. The peak sensitivity of sensor 10 is the wavelength at which sensor 10 generates the most current per light striking an active region of sensor 10. The 50% bandwidth entry is similar to a 3 dB point of an electronic filter. So light of a wavelength on the edge of the 50% bandwidth would produce half the current of the same amount of light at the peak sensitivity wavelength.

According to one preferred embodiment of this invention, two probes 40 are connected with respect to photosensitive semiconductor 20 and optical filter 30 for passing current from photosensitive semiconductor 20. Probes 40 are preferably slotted at one end to facilitate connection with respect to photosensitive semiconductor 20. According to one preferred embodiment of this invention, probes 40 are metal probes such as part number PRP 2562X manufactured by QA Technology Company, Inc.

Figure 4:
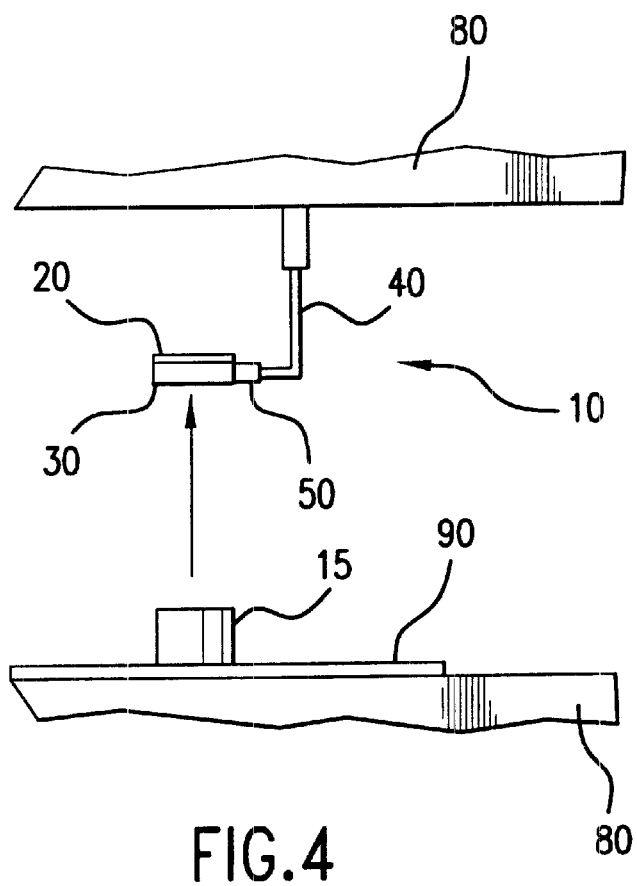
FIG. 4 is a diagrammatic side view of an LED and a sensor in a system according to a preferred embodiment of this invention.

As shown in FIG. 4, according to one preferred embodiment of this invention and depending upon the application, probes 40 each include a 90° bend. Alternatively, probes 40 may be preformed into other configurations or may be bendable to permit forming into suitable configurations.

Bias resistor 50 is preferably connected across probes 40 to provide an output voltage corresponding to an intensity of light of the target wavelength. Bias resistor 50 preferably creates the output voltage based upon the current generated by the target wavelength of light through sensor 10. Bias resistor 50 is preferably selected to create a voltage within a predetermined range depending upon the color to be verified. As a result of the described construction, sensor 10 provides an output voltage corresponding to a target wavelength corresponding to an appropriate color of LED 15 and blocks light outside of the target wavelength.

According to a preferred embodiment of this invention, test system 60 is in communication with sensor 10 for converting the output voltage into pass/fail signal 65. Test system 60 may comprise an in-circuit tester such as those manufactured by Agilent, Genrad or Teradyne in combination with software suitable to translate the output of sensor 10 into pass/fail signal 65.

Test system 60 may additionally include verification module 70 for determining whether the output voltage exceeds a predetermined minimum test voltage for the intensity of light of the target wavelength. In addition, test system 60 may further include warning signal 75 to indicate excessive ambient light between sensor 10 and LED 15. Warning signal 75 is useful for indicating whether the test conditions are optimized and insulated from contamination caused by excess ambient light.

According to one preferred embodiment of this invention, a method for verifying a color of LED 15 in printed circuit board 90 includes first positioning one or more sensors 10 on fixture board 80. Printed circuit board 90 is then preferably positioned within test fixture 80 so that sensor 10 is positioned directly adjacent LED 15.

Figure 6:
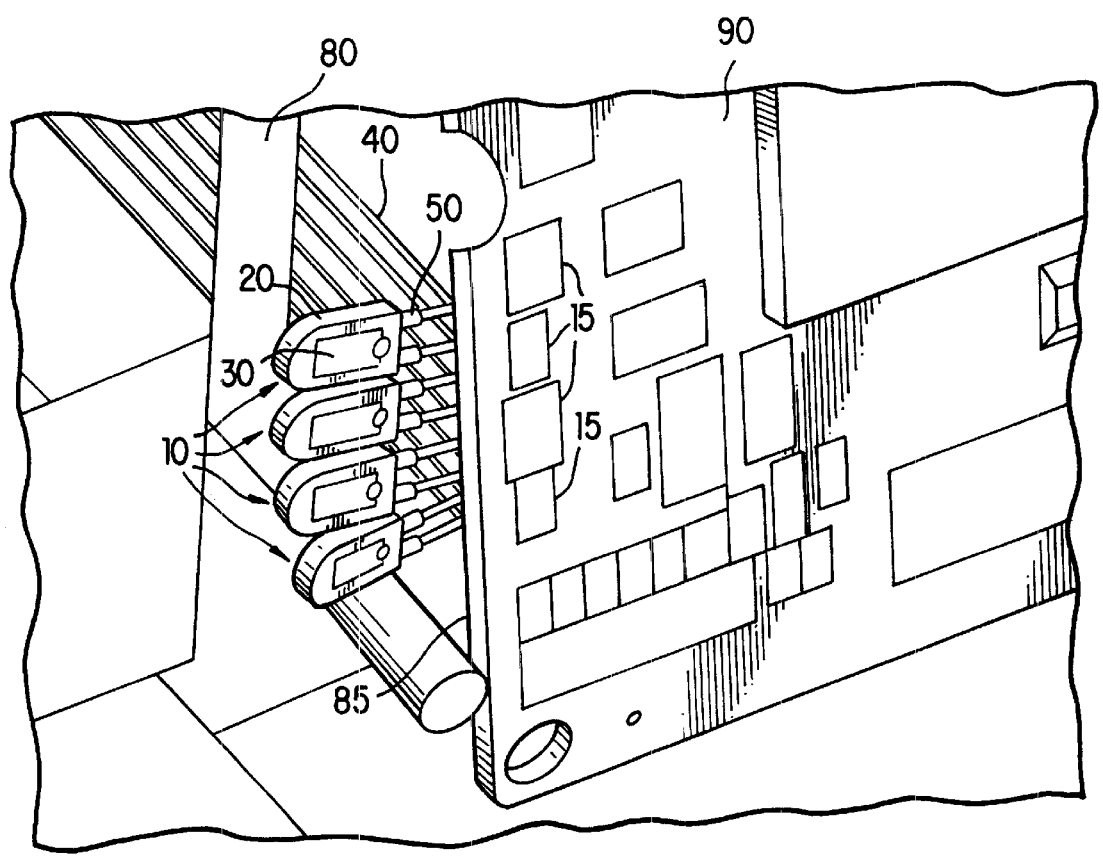
FIG. 6 is a perspective view of a system according to one preferred embodiment of this invention.

According to a preferred embodiment of this invention and as shown in FIG. 6, test fixture 80 includes bed 85 for accepting printed circuit board 90 and one or more sensors 10. Printed circuit board 90 is preferably positioned within bed 85 of test fixture 80. Test fixture 80 may further comprise power source 95 for turning on one or more LEDs 15. According to one preferred embodiment of this invention, test fixture 80 includes baffles (not shown) or is otherwise configured, such as in a clamshell configuration, to block at least a portion of ambient light to printed circuit board 90.

LED 15 is next turned on by powering up the entire printed circuit board 90 or isolating only LEDs 15 with power source 95. Once powered up, LED 15 is illuminated thus exposing sensor 10 to the color of LED 15.

Figure 7:
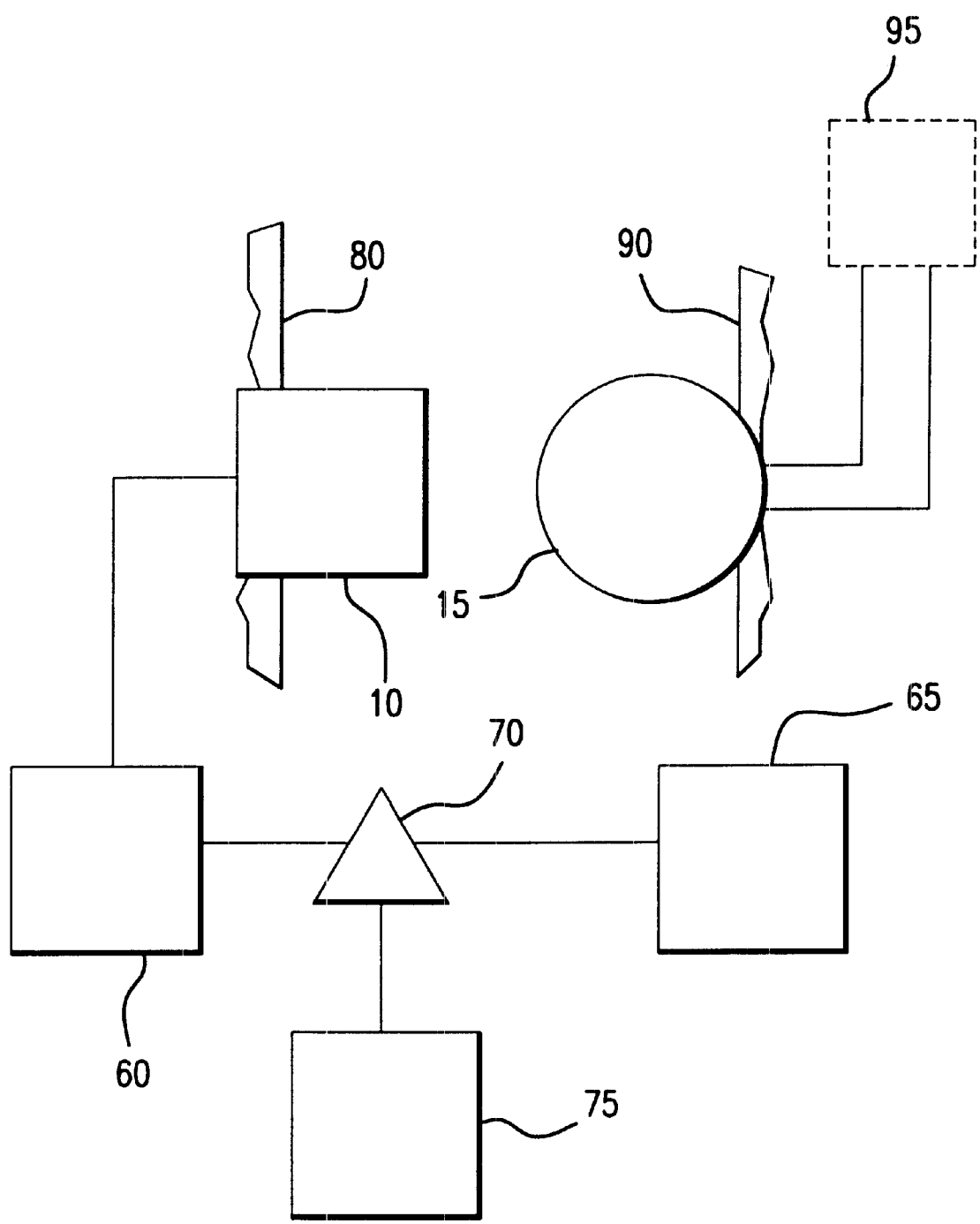
FIG. 7 is a schematic view of a system according to one preferred embodiment of this invention.

As shown schematically in FIG. 7, test system 60 is preferably in communication with sensor 10 and/or test fixture 80 and converts the output voltage generated by sensor 10 to pass/fail signal 65. The output voltage is sent from sensor 10 to test system 60 based upon the intensity of light of the target wavelength. As a result of an analysis of the output voltage, test system 60 generates pass/fail signal 65 to indicate whether the correct LEDs 15 are in position and/or in operation. Such an analysis may include measuring a voltage across bias resistor 50 and comparing the voltage to predicted values for the color to be verified. Preferably such analysis is imbedded in test system 60 as configurable software.

The software and/or test system 60 may be configured to include the steps of: (1) measuring a $V_{on}$ across sensor 10 when LED 15 is on; (2) measuring a $V_{off}$ across sensor 10 when LED 15 is off, (3) subtracting the $V_{on}$ from the $V_{on}$ to determine a nominal voltage; and (4) comparing the nominal voltage with a predetermined minimum voltage for the color to be verified.

The following table provides actual values for measuring and verifying the color of particular LEDs 15.

TABLE 1

Wavelengths of Specific Colors of LEDs

| LED Color | Nominal Wavelength | Peak Sensitivity of Sensor Wavelength/50% Bandwidth |
| --- | --- | --- |
| Red | 655–700 nm | 660 nm/615–705 nm |
| Yellow | 585 nm | no specific sensor |
| Green | 560 nm | 540 nm/505–575 nm |
| Blue | 450–500 nm | 460 nm/415–505 nm |
| Any/Clear | N/A | 560 nm/400–680 nm |

For example, a red LED may produce enough light on the active region of the red sensor for a voltage of 450 mV to be developed across sensor 10. A yellow LED with the same light intensity might produce about 120 mV and a green or blue LED even less. So setting the test limit at 300 mV would guarantee a red LED with a minimum working intensity is installed in printed circuit board 90, also called a circuit card assembly.

From the above chart, the difference between the green and yellow LEDs are very small. According to one preferred embodiment of this invention, a green LED is used to verify that LED 15 is not red or blue. To detect the difference between green and yellow, all variables must be optimized and fault insertion must be used to set the limits. Variations from lot to lot of LEDs 15 may require additional fine tuning of test system 60.

According to one preferred embodiment of this invention, a clear sensor may be used to detect both elements of a bi-color LED turning on. However, preferably one color is selected to detect fully and measuring a reduced signal for the other color.

Figure 5:
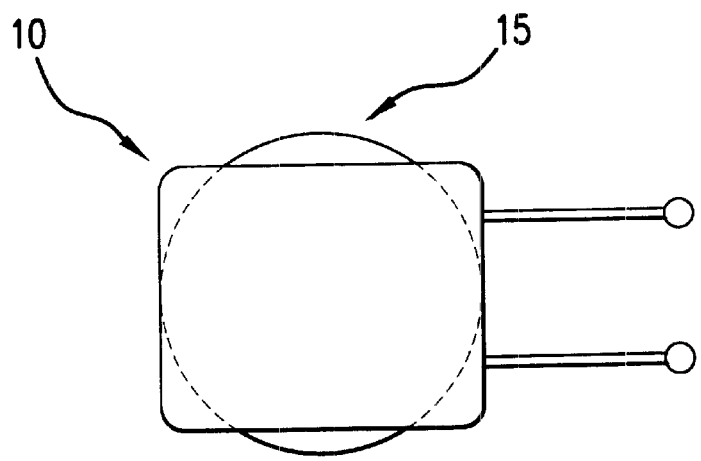
FIG. 5 is a diagrammatic front view of the LED and the sensor shown in FIG. 4 according to a preferred embodiment of this invention.

According to two common configurations of LEDs 15 on printed circuit boards 90, LEDs 15 are positioned so that a light emitting surface is either positioned on an edge of printed circuit board 90 and thus perpendicular to surface of printed circuit board 90, as shown in FIGS. 1–3, or positioned in an interior area of printed circuit board 90 and thus parallel to surface of printed circuit board 90, as shown in FIGS. 4 and 5.

According to one preferred embodiment of this invention, when a light emitting surface of LED 15 is perpendicular to printed circuit board 90, sensor 10 is positioned at least approximately 0.10" away from the light emitting surface and up to approximately 0.20" or more away from the light emitting surface of LED 15. Factors such as the strength of the light source, the intensity of the light source and the amount of ambient light may result in variations of a preferred position of sensor 10 relative to LED 15. A center of an active region of sensor 10, likely a center of optical filter 30, is preferably aligned with a center of a lens of LED 15. Although conventionally compressible, probes 40 are preferably not in a compression when positioning sensor 10 with respect to test fixture 80.

According to one preferred embodiment of this invention shown in FIG. 4, when the light emitting surface of LED 15 is parallel to printed circuit board 90, sensor 10 is likewise positioned at least approximately 0.10" away from the light emitting surface of LED 15 and up to approximately 0.20" or more away from the light emitting surface of LED 15. Like in a parallel configuration, factors such as the strength of the light source, the intensity of the light source and the amount of ambient light may result in variations of a preferred position of sensor 10 relative to LED 15. Probes 40 according to this preferred embodiment are preferably configured so that an approximately 0.250" stroke probe sits above the board approximately 0.15" when engaged.

While in the foregoing specification this invention has been described in relation to certain preferred embodiments thereof, and many details have been set forth for purpose of illustration, it will be apparent to those skilled in the art that the method and apparatus according to this invention are susceptible to additional embodiments and that certain of the details described herein can be varied considerably without departing from the basic principles of the invention.

I claim:

1. An apparatus for verifying a color and operation of an LED in a printed circuit board, the apparatus comprising:
    a test fixture having a bed for accepting the printed circuit board;
    a sensor positioned in the test fixture adjacent to the LED in the printed circuit board, the sensor having an optical filter permitting passage of light from a target wavelength of the color and a bias resistor providing an output voltage corresponding to an intensity of light of the target wavelength; and
    a test system in communication with the sensor, the test system converting the output voltage to a pass/fail signal to verify the color and operation of the LED.

2. The apparatus of claim 1 wherein the test system further comprises a verification module for determining whether the output voltage exceeds a predetermined minimum test voltage for the target wavelength.

3. The apparatus of claim 1 wherein the test fixture includes baffles to block a portion of ambient light to the printed circuit board.

4. The apparatus of claim 1 wherein the sensor further comprises a photosensitive semiconductor.

5. The apparatus of claim 1 wherein the sensor further comprises at least one bendable probe.

6. A method for verifyings a color and operation of an LED having unknown properties in a printed circuit board, the method comprising:
    positioning a sensor on a fixture board;
    positioning the printed circuit board having the LED with respect to the fixture board so that the sensor is positioned directly adjacent the LED;
    turning on the LED t o expose the sensor to the color of the LED;
    sending an output voltage from the sensor to a test system; and
    generating a pass/fail signal based upon the output voltage to verify the color and operation of the LED.

7. The method of claim 6 wherein the sensor comprises:
    a photosensitive semiconductor having an optical filter;
    two probes connected to the photosensitive semiconductor for conducting current from the photosensitive semiconductor in response to light; and
    a bias resistor connected between the two probes.

8. The method of claim 7 wherein the bias resistor is selected to create a voltage within a predetermined range depending upon the color to be verified.

9. The method of claim 7 further comprising:
    measuring a voltage across the bias resistor and comparing the voltage to predicted values for the color to be verified.

10. The method of claim 6 further comprising:
    measuring a $V_{on}$ across the sensor when the LED is on;
    measuring a $V_{off}$ across the sensor when the LED is off;
    subtracting the $V_{off}$ from the $V_{on}$ to determine a nominal voltage; and
    comparing the nominal voltage with a predetermined minimum voltage for the color to be verified.

11. The method of claim 6 further comprising:
    providing a voltage through each side of the LED without powering up the printed circuit board.

12. An apparatus for verifying a color and operation of an LED in a printed circuit board comprising:
    a sensor having a photosensitive semiconductor; an optical filter connected with respect to the photosensitive semiconductor, the optical filter permitting passage of light from a target wavelength of the color; two probes connected with respect to the photosensitive semiconductor, the two probes for passing current from the photosensitive semiconductor; and a bias resistor connected across the two probes, the bias resistor providing an output voltage corresponding to an intensity of light of the target wavelength; and
    a test system in communication with the sensor for converting the output voltage into a pass/fail signal and thereby verify the color and operation of the LED.

13. The apparatus of claim 12 further comprising a test fixture for anchoring the sensor adjacent to the LED in the printed circuit board.

14. The apparatus of claim 12 wherein the test fixture further comprises a power source for turning on the LED.

15. The apparatus of claim 12 wherein the test system further comprises a verification module for determining whether the output voltage exceeds a predetermined minimum test voltage for the intensity of light of the target wavelength.

* * * * *